United States Patent [19]

Wallace

[11] Patent Number: 5,759,331
[45] Date of Patent: Jun. 2, 1998

[54] METHOD OF ENSURING CONDUCTIVITY IN THE MANUFACTURING OF A MULTI-LAYER CERAMIC COMPONENT CONTAINING INTERLAYER CONDUCTIVE-FILLED VIA HOLES

[75] Inventor: Kenneth M. Wallace, La Jolla, Calif.

[73] Assignee: Paul J. Dostart, San Diego, Calif.

[21] Appl. No.: 706,982

[22] Filed: Sep. 3, 1996

Related U.S. Application Data

[60] Division of Ser. No. 376,055, Jan. 20, 1995, abandoned, which is a continuation-in-part of Ser. No. 275,763, Jul. 15, 1994, abandoned.

[51] Int. Cl.$^6$ ............................................. B32B 31/18
[52] U.S. Cl. .................... 156/248; 156/252; 156/272.8; 156/277; 264/400
[58] Field of Search ........................... 156/89, 248, 252, 156/253, 270, 272.8, 277; 264/900; 427/97; 83/30

[56] References Cited

U.S. PATENT DOCUMENTS

| | | | |
|---|---|---|---|
| 3,770,529 | 11/1973 | Anderson | 156/89 X |
| 3,852,877 | 12/1974 | Ahn et al. | 156/89 X |
| 4,528,275 | 7/1985 | Hodge . | |
| 4,539,058 | 9/1985 | Burgess et al. | 156/261 X |
| 4,764,233 | 8/1988 | Ogihara et al. | 156/89 |
| 4,802,945 | 2/1989 | Opina | 156/253 X |
| 4,990,080 | 2/1991 | Kakimoto | 156/89 X |
| 5,087,396 | 2/1992 | Zablotny et al. | 264/400 |
| 5,271,150 | 12/1993 | Inasaka | 156/89 X |
| 5,274,916 | 1/1994 | Kawabata et al. . | |
| 5,294,567 | 3/1994 | Dorfman et al. . | |
| 5,412,865 | 5/1995 | Takaoka et al. | 156/89 X |

FOREIGN PATENT DOCUMENTS

92/13435  8/1992  WIPO .

OTHER PUBLICATIONS

A.J. Blodgett, Jr., "A Multilayer Ceramic, Multi-chip Module," 30th Electronic Components Conference, pp. 283-285, 1980.

*Primary Examiner*—Curtis Mayes
*Attorney, Agent, or Firm*—Baker, Maxham, Jester & Meador

[57] ABSTRACT

A ceramic slurry is deposited onto a plastic carrier tape and allowed to dry before the tape is inverted for further processing. The plastic carrier tape remains with the ceramic during subsequent via hole punching and printing steps. The carrier tape also remains with the dried ceramic to support the same when the via holes are filled with conductive material which helps retain the material within the via holes. The carrier tape is peeled off as each layer of ceramic is built up to form a laminated multi-layer ceramic component. This provides a smooth, uniform surface at the top of each conductive-filled via hole. In order to ensure that the conductive properties of each conductive-filled via are not compromised a preparatory step of creating a hole in the plastic carrier tape that is very small in comparison to the via hole placed in the ceramic tape is included. The small hole in the plastic carrier serves as a bleed hole for air trapped in the conductive paste. The conductive paste in the plastic layer is also made easier to remove because the small area of the paste in the small hole decreases its tensile strength relative to the paste in the ceramic layer. This decreased strength increases the likelihood that it will fracture under a shear stress and separate from the paste in the ceramic layer.

11 Claims, 5 Drawing Sheets

METHOD OF ENSURING CONDUCTIVITY IN THE MANUFACTURING OF A MULTI-LAYER CERAMIC COMPONENT CONTAINING INTERLAYER CONDUCTIVE-FILLED VIA HOLES

This application is a division of application Ser. No. 08/376,055, filed Jan. 20, 1995, now abandoned, which is a continuation-in-part of application Ser. No. 08/275,763, filed Jul. 15, 1996, now abandoned.

BACKGROUND OF THE INVENTION

The present invention relates to the fabrication of electronic components, and more particularly, to a process of fabricating multi-layer ceramic components with interlayer conductive-filled via holes that permits thinner ceramic layers and larger format sizes than previously feasible.

A variety of commercially available electronic components have included multiple ceramic layers with interconnected circuits. In addition, hybrid substrates, integrated circuit packages, and multi-chip modules have been commercially available which have included multiple ceramic layers. Passive devices such as capacitors and inductors have also been commercially available which have included multiple ceramic layers.

There are several conventional methods of manufacturing multi-layer ceramic components. Each requires the formation of thin layers of a ceramic dielectric having the desired electrical properties and the delineation of a pattern or a matrix of patterns of conductive circuit pathways or electrodes between the layers of ceramic. Interconnection between the layers is provided by placing via holes in the layers at the correct positions and filling such via holes with conductive materials which contact the printed conductive circuit pathways captured between the ceramic layers. Depending on the kinds of materials used and the pattern of the conductors, a variety of different kinds of devices can be created using the same basic set of processes. The planar geometry of the sheets of ceramic which are patterned with conductors and then stacked up, encourages the use of a matrix design in which many smaller parts are organized in a two dimensional matrix and are made in a multiplicity. When the matrix is cut up, individual devices are forms. The individual devices are sintered at elevated temperature to cause the particles of ceramic and metal contained within the device to join and yield the final properties as required for the desired circuit performance.

Conventional methods of manufacturing multi-layer ceramic components have been able to accommodate increasing circuit density by reducing line width, space width, via hole size and via hole spacing. Increased circuit density has also been accommodated by improving via hole alignment accuracy. There are a number of steps common to the conventional methods of manufacturing multi-layer ceramic components which must be controlled in order to achieve the required circuit densities with acceptable levels of quality and yield at a competitive cost.

The first major step is to form the ceramic sheet. It is desirable to start with a uniform mix of ceramic constituents which is free from impurities or bubbles. It is also necessary to ensure accurate control of the final sheet thickness. The formed ceramic sheet must be protected from damage due to handling. The finish of the sheet must possess the desired handling characteristics.

The second major step is the via hole formulation. The via holes must be correctly positioned to match the circuit pathway. They must have a consistent diameter and must be free from debris internally or externally. The ceramic material around the via holes must be free from stress cracking. The via hole formation should be free from stresses that distort the pattern of via holes already formed.

The third major step is the filling of the via holes. Each such hole must be completely filled but must not protrude from the surface of the ceramic material. The filled via holes must be free from dimpling at the surface of the ceramic material which is caused by loss of volume during the drying of the vehicle in the conductive filler. It is also important that the conductive filler not be subject to undue shrinkage during drying in order to avoid pull-back at the interface between the conductive filler and the ceramic material in the via holes.

The fourth major step common to the conventional methods of manufacturing multi-layer ceramic components involves the deposition of the conductive electrode matrix pattern onto the ceramic material. This requires compatibility between the electrode chemistry and the ceramic sheet chemistry. Precise control of the deposition thickness is also required. It is also necessary to control the quality of the edge definition of the electrode pattern. Accurate pattern spreading must be achieved. In addition, accuracy of the electrode positioning in the matrix must be controlled to prevent distortion. The smoothness of the electrode surface must also be maintained and the deposited conductive electrode matrix pattern must be free from contamination or voids. Where screening techniques are used, it is necessary to avoid damage of the thin ceramic material due to lifting induced by sticking to the bottom of the screen. Finally, it is necessary to dry the printed electrode matrix pattern without contamination, smearing or distortion.

The fifth major step involves the stacking of alternating layers of ceramic material and electrode matrix pattern. During this step, the electrode patterns must be vertically aligned without being distorted. The stacking must be done in a delicate manner to prevent damage to the ceramic sheet material. Air must not be trapped between the alternating layers of ceramic material and electrode matrix pattern. Electrode position information relative to a fixed reference point must be maintained in order to enable the subsequent cutting operation.

The sixth major step involves the lamination of ceramic sheet material with adhered electrode matrix pattern into a monolithic block. It is important during this step to prevent loss of registration of the via holes or else interconnection of the electrode matrix patterns between the various layers will not be achieved. Where high pressure lamination techniques are utilized, precautions must be taken to avoid distortion of the electrode matrix patterns delineated on the various ceramic sheets in the stack. It is desirable to maintain constant pressure and uniform temperature over a predetermined time interval in the lamination process. The position of the electrode matrix patterns must be maintained in order to enable the subsequent cutting operation.

The seventh common step in the conventional methods of manufacturing multi-layer ceramic components involves the cutting of the laminated layers into individual components or devices. It is necessary to accurately establish the correct cutting positions. Distortion of the matrix during the cutting must be prevented or else it will induce cut position errors. The induction of stresses into the laminated layers must be avoided as this could result in delaminations, cracks or chips. The cutting process must not smear the electrode matrix patterns. The cut edges must be square relative to the top and bottom surfaces of the devices, i.e. not skewed. Size variations between individual devices should not exceed tolerance specifications. The cut devices must be freed from any supporting substrate without forces that would damage the devices.

The final step common to the conventional methods of manufacturing multi-layer ceramic devices involves the thermal processing of the individual devices after they have been cut from the laminated layers. Such thermal processing is usually accomplished by placing the devices in an oven. This burns out organic constituents and sinters the ceramic material and conductive material.

To manufacture multi-layer ceramic components with increased function density per unit volume it is necessary to make the layers of ceramic thinner while increasing the total number of layers. Current manufacturing technology for ceramic multi-layer packages is limited to dielectric thickness of around fifty microns and fifty layers. Thicker ceramic allows higher layer counts, but overall thickness increases proportionately.

SUMMARY OF THE INVENTION

In accordance with my method, a multi-layered ceramic component is fabricated by first depositing a slurry of a ceramic material onto a layer of plastic carrier tape. The slurry is allowed to dry so that it adhers to the tape, thereby forming a ceramic layer. A first laser beam is applied to the ceramic layer until a hole of a first predetermined diameter is formed in the ceramic layer. A second laser beam is applied to plastic carrier tape in an area adjacent the hole in the ceramic layer until a hole of a second predetermined diameter smaller than the first predetermined diameter is formed in the plastic carrier tape.

DETAILED DESCRIPTION OF THE PREFERRED EMBODIMENTS

A. Forming the Ceramic Tape

Figure 1:
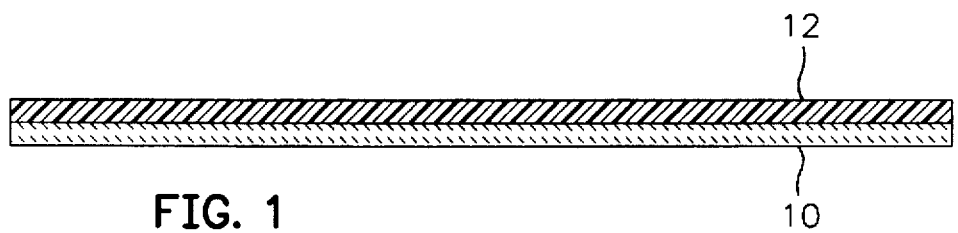
FIG. 1 is a diagrammatic sectional view of a plastic carrier tape having an underside coated with a dried ceramic slurry.

Ceramic powder is first mixed with a polymer resin to form a slurry. This slurry 10 (FIG. 1) is deposited onto a polymer plastic carrier web or tape 12 in a controlled thickness and allowed to dry. The ceramic slurry 10 may be deposited by tape casting or other well known ceramic slurry deposition process onto the upper surface of the carrier tape. The tape is then inverted before further processing occurs. As is conventional, the ceramic powder may be comprised of Aluminum oxide, Aluminum nitride or Barium titanate based formulations. As is conventional, the polymer resin may be an acryloid polymer or polyrinylbutanol, or others. The polymer carrier tape 12 is preferably made of polyester or polypropylene and measures between twenty-five and two-hundred microns in thickness and between two and twelve inches in width. The carrier tape 12 is preferably supported and propelled by electric motor driven rollers.

B. Forming and Filling Via Holes

My process provides for the production and use of thinner than normal ceramic by using the plastic carrier tape 12 to protect and stabilize the ceramic 10 during processing. In particular, my process uses the carrier tape 12 to support the ceramic 10 during via hole forming, printing and stacking.

The plastic carrier tape 12 protects the ceramic 10 in several ways. When the tape 12 is moved between operations or stored for subsequent processing, it is not necessary for anything to contact the ceramic 10 adhered thereto. While the ceramic 10 is being stored it can be rolled up on its carrier tape 12 and thus protected from physical damage or contamination. When the ceramic 10 is being moved into position for punching, printing or stacking it is not subject to forces which might distort it and cause problems such as wrinkling on the stack or during printing.

Figure 2:
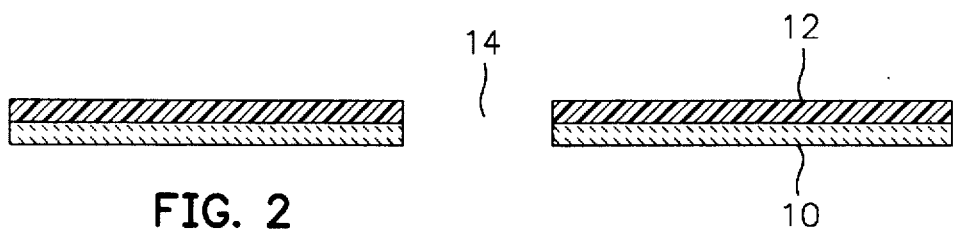
FIG. 2 is a diagrammatic sectional view the ceramic coated carrier tape showing a via hole formed therethrough.

FIG. 2 illustrates the formation of one of a plurality of via holes 14 which are simultaneously punched through the dried ceramic 10 and carrier tape 12. Punching the via holes involves steps in which the ceramic 10 is moved in and out of the punching press. In some cases there is pressure applied to the ceramic 10 by a punch stripper. The punching itself induces stress around the hole caused by radial flow before the shear plane forms. For the via holes to be correctly located, the ceramic 10 must lie flat and any elasticity inherent in thin ceramic must be allowed to release. The use of the plastic carrier tape 12 on which the thin layer of ceramic 10 is adhered provides lateral stability that effectively resists all the above mentioned sources of distortion. The ceramic and plastic are punched simultaneously.

Via hole filling is performed while the ceramic 10 is attached to the plastic carrier tape 12. Any tendency for the ceramic to stick to a via fill stencil and be stretched as the stencil is removed is resisted by the presence of the tape. The via holes may be filled with a conductive paste comprising Gold, Silver, Palladium or Tungsten particles in a polymer binder, as is known in the art.

C. Printing Process

After drying the ceramic 10 is printed with a pattern of conductive metallic electrodes (not illustrated). The printing is commonly performed by silk screen printing, but other methods can be used. Registration is provided so that the printed images can be stacked one above the other in subsequent stacking steps.

The registration is accomplished either of two ways. The first is by punching registration holes in the carrier tape 12 in the fashion of movie film and then using the holes to position the tape during printing and stacking. The second method is the print registration marks on the ceramic 10 along with the pattern of electrodes and then observe the position of the marks during the stacking operation. The preferred method of observing the marks is by means of video cameras with high magnification connected to a computer vision system and a servo positioner.

When the ceramic 10 is being printed it can be held with a vacuum without problems associated with drawing the ceramic film into the texture of the surface of the vacuum chuck or chuck liner. With very thin ceramic this can be a significant problem for high quality printing. By supporting each layer on a flat surface for electrode printing there is no deterioration of the print quality with increased layer count. While drying, the presence of the carrier tape 12 inhibits shrinkage which is common in unsupported processes due to evaporation of ceramic binder components and the ink vehicle.

Advantages of the use of a plastic carrier tape 12 for the printing and subsequent stacking steps include added degrees of freedom in the selection of binder formulations for the ceramic film. Since the ceramic 10 is not self supporting it needs little strength and less than the usual amount of plasticity. The usual constraints still apply to the lamination and cutting stages however.

D. Stacking and Cutting

Figure 6:
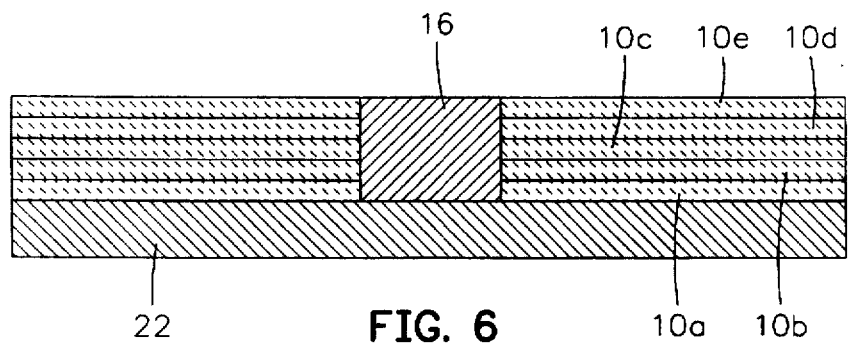
FIG. 6 is a diagrammatic sectional view illustrating a lamination of layers of ceramic with aligned filled via holes which is ejected from the cutting die.

After the printing operation the sheets are transferred to a stacking machine where they are placed together in a precisely aligned stack contained within a die. The ceramic and metal electrode layers of the stack are pressed together at high pressure (6000 psi) each time a new layer is added. This is referred to as lamination. Heat can be applied at the same time as the pressure to assist with adhesion. The layers blend together into a solid laminated assembly as shown in FIG. 6. Alignment of the printed electrode patterns is achieved by the above described registration methods. The alignment is preserved and protected by distortion under the high pressure by the walls of the die.

Figure 4:
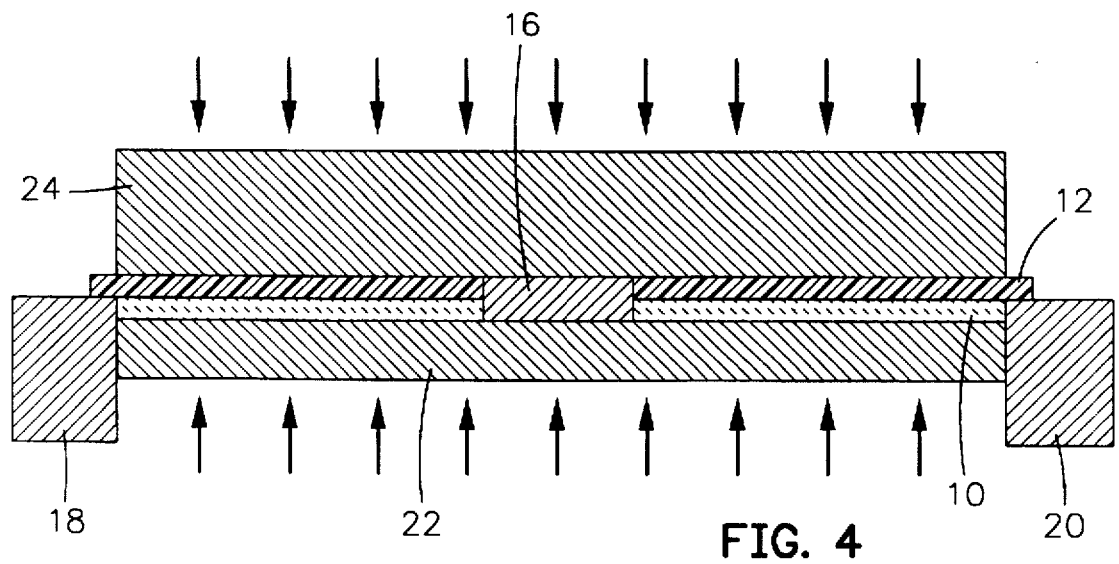
FIG. 4 is a diagrammatic sectional view illustrating the stacking of segments of ceramic coated carrier tape having filled via holes and the cutting thereof by a punch and die.
Figure 7:
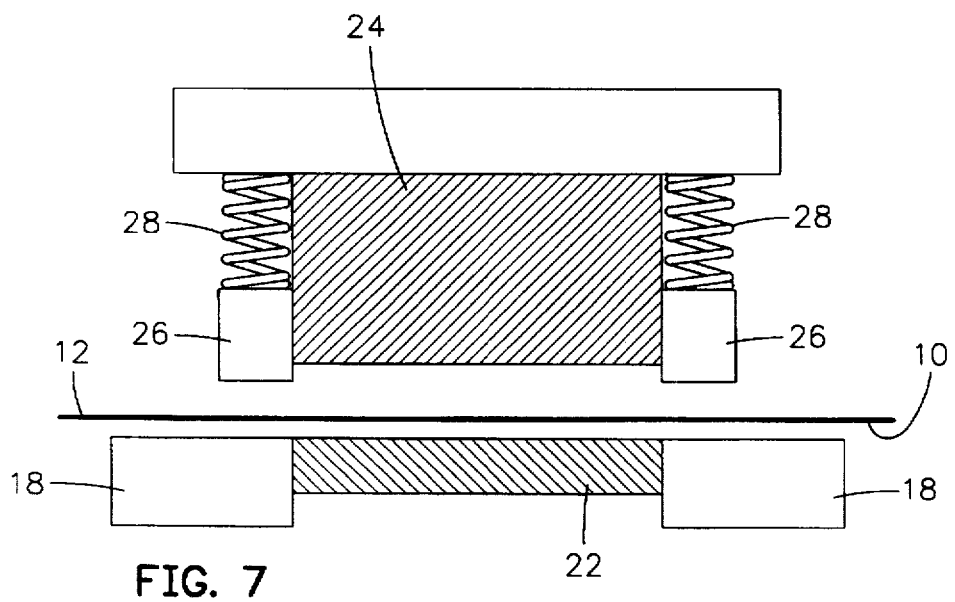
FIGS. 7-9 are a sequence of diagrammatic part sectional and part side elevation views illustrating the cutting of each ceramic layer backed by a plastic carrier tape in accordance with the method of the present invention.

Each successive layer is placed into the stacking machine ceramic side down and plastic side up over the die cavity (FIG. 4). The punch 24 (FIG. 7) descends from above and applies pressure to the tape pressing the ceramic into the die 18 and forcing it against the material contained in the die from previous cycles of operation. In the case of the first ceramic layer this is a paper base which is provided for the ceramic to adhere to. All subsequent layers are laid down on the previous layers of ceramic.

Figure 5:
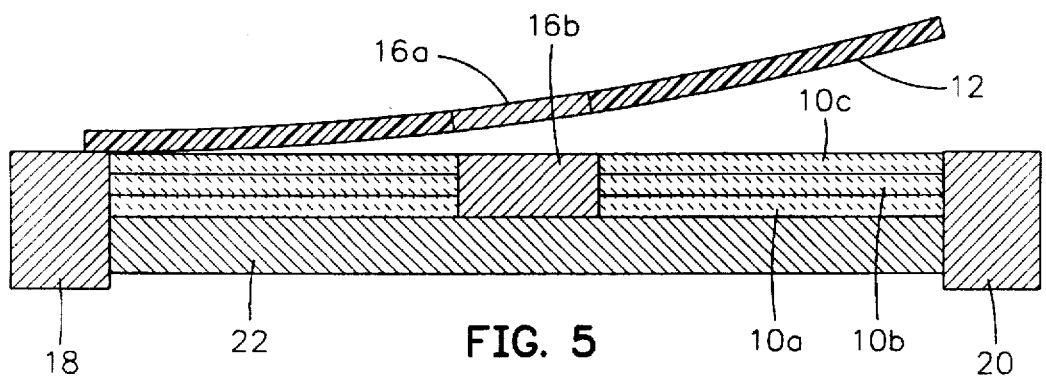
FIG. 5 is a diagrammatic sectional view illustrating the pealing away of the plastic carrier tape from the top of a stacked and cut lamination of ceramic layers with filled via holes.

While stacking, the printed ceramic 10 maintains its adhesion of the plastic carrier tape 12. The adhesion is lessened by the pressure of the lamination cycle, but the bond holds and continues to assure that there will be minimal distortion. After pressure is released and the punch 24 is withdrawn, the plastic carrier tape 12 can be peeled off as illustrated in FIG. 5.

Figure 3:
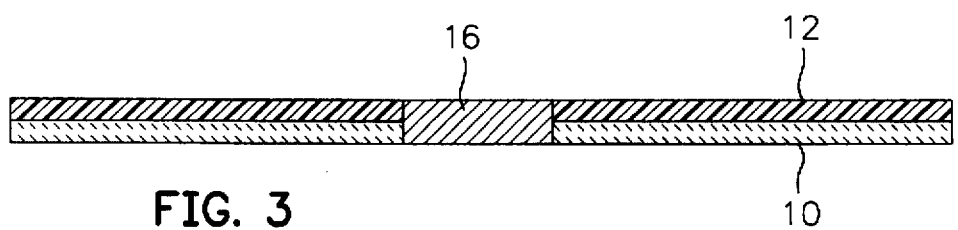
FIG. 3 is a diagrammatic sectional view of the ceramic coated carrier tape with the via hole filled with conductive paste.

While transferring the ceramic and printed electrodes to the stack, the carrier film 12 prevents distortion due to handling and positioning and inhibits other distortions induced by the high pressures involved in the transfer pressing operation. The high pressure of lamination (FIG. 4) causes hydrostatic filling of the via holes 14 and presses the conductive material 16 (FIG. 3) against the walls of the via hole. Any air contained in cracks, voids or pull backs is expelled. A close fitting die is used to contain the ceramic and prevent extrusion which might otherwise be caused by the pressure of lamination. The pressure of lamination is high enough to compress the ceramic so that no more flow or further reduction in thickness will occur during the lamination of subsequent layers. This allows the building of very high layer count stacks with less distortion than experienced in the conventional processes where all the sheets are laminated simultaneously after collating.

During the lamination process illustrated in FIG. 4 the ceramic 10 is cut by die 18. The carrier tape 12 remains uncut. The ceramic 10 is pressed against a metal support plate 22 by a punch 24 which squeezes down on the carrier tape 12.

During stripping or removal of the carrier tape 12 (FIG. 5) at the conclusion of the transfer of each ceramic layer 10a, 10b and 10c, etc., the via fill 16 separates into a waste portion 16a that remains in the carrier tape 12 and an active portion 16b which is located in the ceramic layer. A clean and even separation plane is established which produces a good surface for the head of the via.

Figure 8:
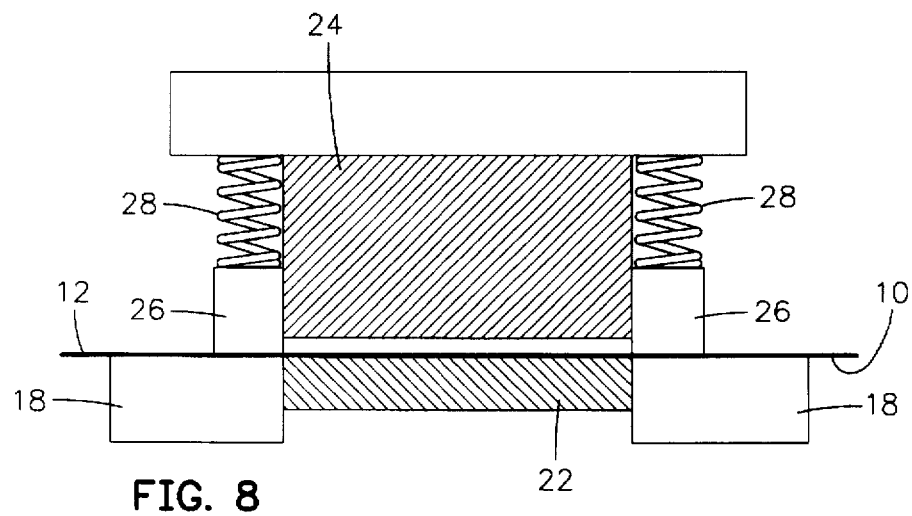
Figure 9:
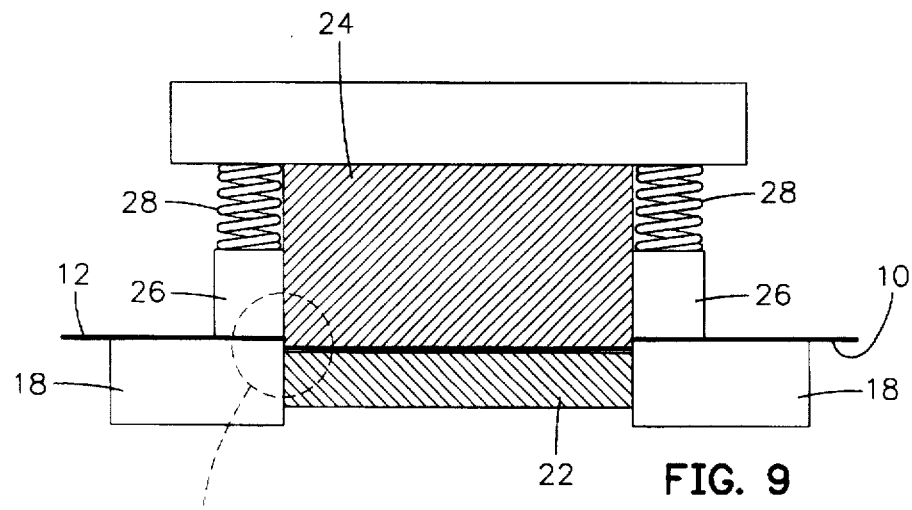
Figure 10:
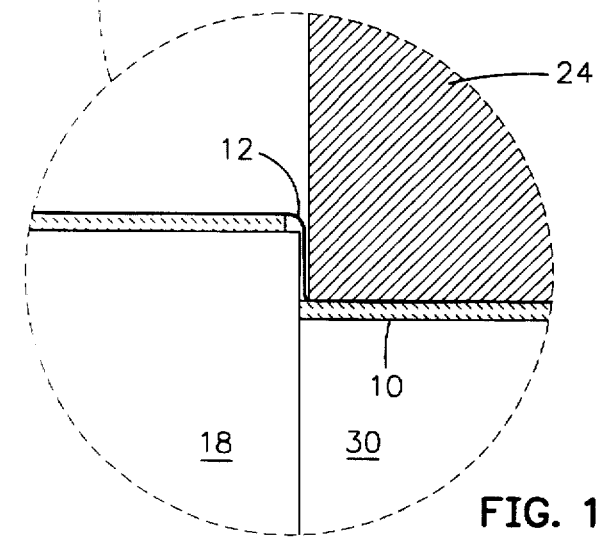
FIG. 10 is a greatly enlarged sectional view illustrating the manner in which the plastic carrier tape is stretched and uncut when a die sheers the underlying ceramic layer.

My preferred technique of scoring the ceramic 10 while preserving the integrity of the plastic carrier tape 12 involves selectively stretching the plastic around the mouth of the die 18. This is done by clamping the ceramic/plastic tape between the face of the die 18 and a stripper ring 26 (FIG. 7) which surrounds the punch 24 as illustrated in FIG. 8. The stripper ring 26 descends along with the punch 24, but since it extends beyond the punch it contacts the plastic carrier tape 12 first. The stripper ring 26 reciprocates around the punch 24 and is biased downwardly by a surrounding spring 28. As the punch 24 continues to descend the clamping force between the stripper ring 26 and the die 18 face increases. As the punch 24 contacts the plastic/ceramic tape as illustrated in FIG. 9, the support plate 22 descends a relatively small distance and the tape 12 is forced into the die 18. Since the tape 12 is clamped all around the die 18 it must stretch to move into the die. The clearance between the punch 24 and die 18 is just large enough to accommodate the plastic without shearing it. In addition, the edges of the punch 24 have a very slight radius to inhibit their cutting action. The effect of this structure is to stretch the ceramic/plastic tape over the sharp edges of the die 18 as shown in the enlarged detailed view of FIG. 10.

Since the ceramic side is facing the die, it encounters the sharp edge and is interrupted (scored) by the pressure. The scoring of the ceramic 10 by the die 18 is aided by the simultaneous stretching of the plastic carrier tape 12 which backs the ceramic 10 in the area where the scoring is occurring. This method is intended to give superior performance compared to the conventional controlled pressure method so that there will be fewer instances of inadvertent cutting of the plastic carrier tape 12. When the tape 12 is cut the stripping is made more difficult since the automatic striping device will pull on the cut carrier in such a way that the stripping force will not be delivered to the intended location.

In the die cavity 30 (FIG. 10) where the ceramic and metal layers are built up the steel support plate 22 is placed beneath the stack to accept the build up. The steel plate 22 functions as a pallet and is provided with a thick paper cover layer (not illustrated) which receives the first layer of ceramic 10. The paper is intended to provide a surface against which the blades used in the cutting operation can stop and therefore not come into contact with the steel pallet which would cause damage.

In an alternate way of removing the plastic carrier tape 12 after the ceramic 10 is adhered to the stack, the stacking machine is designed so that the pressure applied to the punch 24 as it presses against the carrier tape 12 is carefully limited. The punch 24 must be driven with enough force to cut the ceramic 10 but must be stopped prior to entering the die 18 far enough to cut the plastic carrier tape 12. This method depends upon the relative resistance to cutting of the ceramic versus the plastic film. The ceramic 10 is relatively weak and the plastic carrier tape 12 is relatively tough. Consequently, a pressure range can be found that will press the sharp edges of the die 18 against the ceramic 10 hard enough to score it all around. Normally this can be done without cutting the plastic carrier tape 12.

E. Final Processing

The laminated layers are cut into individual devices or components in conventional fashion. They are then heated in conventional fashion to burn out organic constituents and to sinter the ceramic and conductive patterns.

F. Method for Ensuring that via is Formed with Proper Conductivity

I have discovered a method for ensuring that the proper conductivity of the via is established during manufacturing by including a sequence of preparatory steps prior to filling the via hole. Very large scale integrated circuit chips may contain up to a million via holes, but if even one via does not conduct properly the chip cannot be used. Accordingly, it is very important that to increase the probability that a via will not have conductivity problems. One of the most common conductivity problems is air bubbles in the via that interfere with a conductive path in the via. Another problem related to the conductive path of the via occurs when part of the conductive paste used for filling the via hole protrudes past the original hole after the plastic layer is removed. The steps described below help eliminate trapped air while also reducing the probability that any of the conductive paste will remain protruding from the via hole after the ceramic layer is removed.

Figure 12:
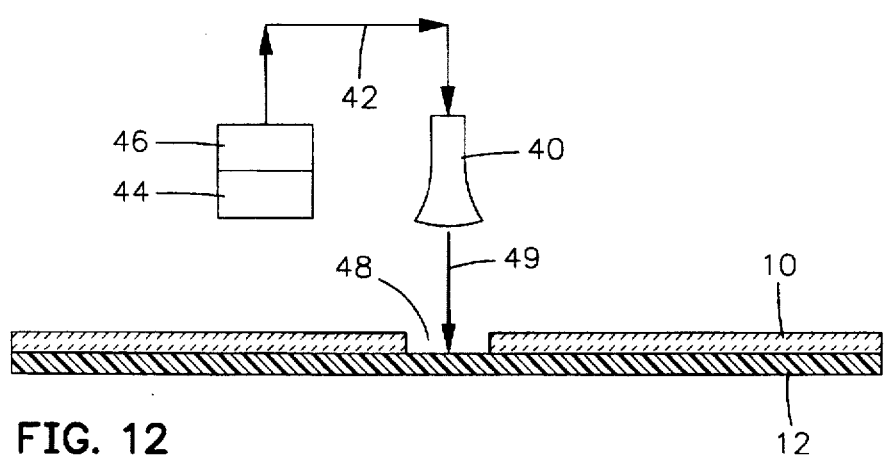
FIG. 12 is a diagrammatic sectional view of the ceramic layer of FIG. 11 showing a via hole formed therethrough.

Referring to FIG. 12, a via hole must extend through ceramic layer 10 and an adjacent plastic layer 12. The via is formed in the usual fashion by filling the hole with a conductive metal paste. The paste passes through both the ceramic and the plastic. The plastic must be removed in order to prepare the ceramic layer for being included as part of an electronic chip. Unfortunately, removing the plastic tends to damage the via hole conductive filling. Since the conductive paste has a large proportion of precious metals (e.g. Gold and Silver), this is very costly. Furthermore, when the paste in the via dries there is a danger that shrinkage will cause the via to fall out.

I have discovered a means and method for preventing, or at least lessening detrimental effects caused by the above problem. The solution involves reducing the diameter of a hole in the plastic so that it is relatively small compared to the via hole in the ceramic. I have recognized that the hole in the plastic need only be large enough to release air pressure created by the conductive paste being placed in the via. It is important to allow any air trapped within the via fill material to escape or the conductive properties of the via may be compromised by air bubbles. For example, if a via hole in the ceramic is 0.004 inch in diameter, then the hole in the plastic need only be about 0.001 inch in diameter. Further, if the hole in the plastic is sufficiently small then the tensile strength of the conductive paste in the plastic layer will tend to be very small because its cross sectional area is small in comparison to that of the paste in the via hole in the ceramic layer. Thus, the portion of paste in the plastic layer will be more likely to shear and therefore fracture from the paste in the via hole. The fracturing of the paste eliminates any protruding conductive material extending above the intended area for the via.

Figure 11:
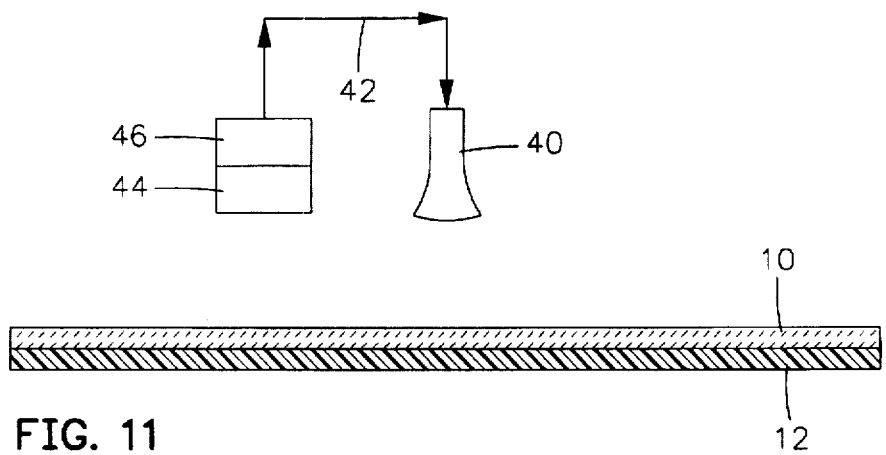
FIG. 11 is a diagrammatic sectional view of a plastic carrier tape layer and a dried ceramic slurry layer illustrating a relationship to a hole cutting apparatus useful with the present invention.

Referring to FIG. 11, a ceramic layer 10 formed by the process described above is positioned over a plastic carrier tape layer 12 prior to cutting and filling a via hole with conductive paste to form a conductive via. A laser light source 40 connected through a combined control and power bus 42 to a power supply 46 and control logic 44 is preferably used to cut a via hole in both layers. It is well known in the art of hole punching that a laser controlled by known numerical control methods may be controlled by logic, such as logic 44, to be powered on for a predetermined finite period of time in order to cut a hole of very small and precise dimensions. Thus, it is preferred that power supply 46 be controlled by logic 44 to allow laser light source 40 to be pulsed on for a period of time sufficient to cut a via hole in each of the layers. It should also be understood that only one laser light source is shown, for the sake of simplicity. However, more than one may be used and the choice to use more than one will depend on factors such as the composition of the materials used in the layers 10 and 12 and the size of the holes desired, as is well known in the art.

Figure 13:
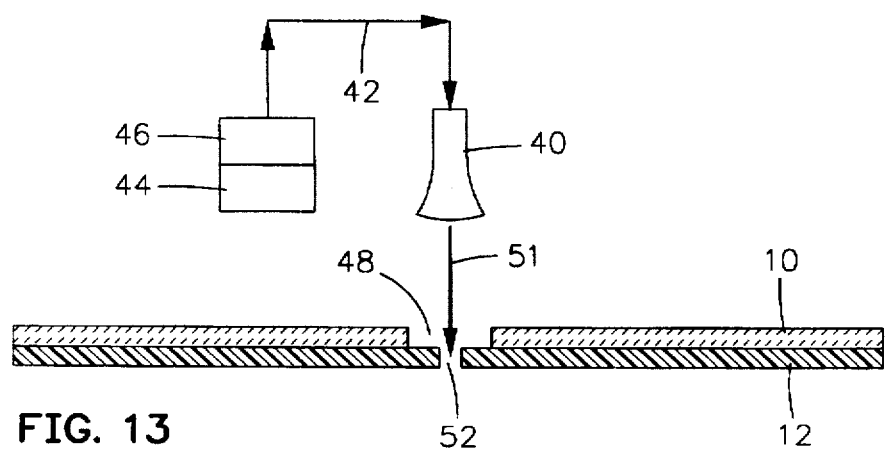
FIG. 13 is a diagrammatic sectional view of the plastic layer of FIGS. 11 and 12 showing a via hole formed therethrough.

Referring to FIGS. 12 and 13, my preferred technique for creating the correctly sized holes is by using an Eximir laser to focus on the ceramic layer to burn hole 48. The laser may be turned on and off in pulse fashion, as is well known in the art. Preferably, a first pulse applying a beam 49 of a proper focal length is applied at the ceramic layer to create the hole 48. Next, the laser beam may be refocused and another pulse applied in order to apply beam 51 of proper focal length to create the very small hole 52 (FIG. 13) in the plastic layer. However, other methods for creating the holes may be used without departing from the spirit and purpose of the invention. It is important to create the holes in order to eliminate trapped air and reduce the risk of protruding via fill material; however, the technique for doing so is not critical. It is well known in the laser hole cutting art that Eximer lasers are well suited to cutting very small holes due to their pulsing capability. However, it may be possible to use another type of laser effectively well (e.g. a $CO_2$ or Ultraviolet laser) as advancements are made in that art. Additionally, two different types of lasers could be used simultaneously or in a sequential fashion to cut the holes, such as a $CO_2$ laser for the larger hole in the ceramic and a Eximer laser for the smaller hole in the plastic.

Figure 14:
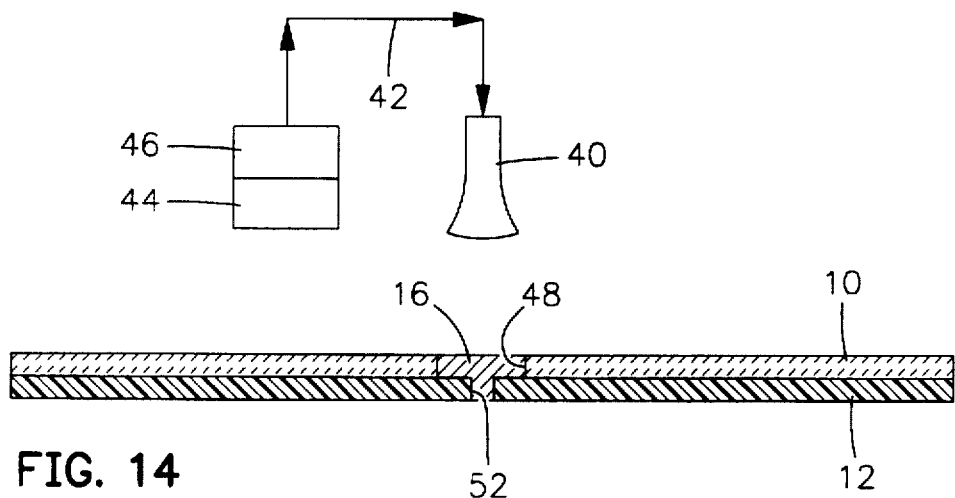
FIG. 14 is a diagrammatic sectional view of the via holes of the ceramic and plastic layers of FIG. 13 filled with conductive paste material in accordance with the present invention.
Figure 15:
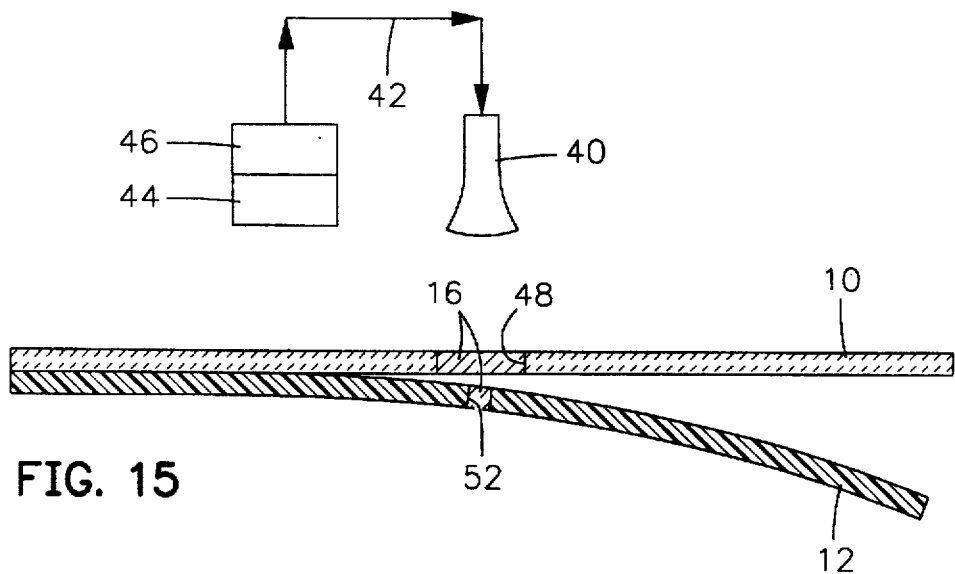
FIG. 15 is a diagrammatic sectional view of the plastic layer of FIG. 14 being separated from the ceramic layer of FIG. 14 in accordance with the present invention.

Referring to FIGS. 14 and 15, once the holes are made then the conductive paste 16 or via fill material may be applied in the usual fashion to fill hole 48 in the ceramic layer. It is preferable to arrange the ceramic layer above the plastic layer so that gravity will aid the flow of conductive material 16 from the large hole 48, which will eventually become the via, into the small hole 52. As the paste 16 enters the small hole, the created vacuum will pull air from the via into the small hole 52. Any air bubbles trapped in the small hole will be become part of the waste material that is discarded with the plastic layer. Prior to removing the plastic layer, a conductive pattern may be printed on the ceramic layer as described above. and the ceramic material may be cut with a die without cutting the plastic carrier tape layer. As shown in FIG. 15, when the plastic layer 12 is removed, the small amount of conductive paste in the small hole 52 is likely to sheer evenly from the conductive paste forming a via in via hole 48, for the reasons described above. Thus, the conductive properties of the via are ensured by the inclusion of the above described preparatory steps to be done prior to filling the via with conductive material.

G. Conclusion

My method provides a number of advantages. It reduces the minimum thickness of ceramic that can be handled in large sheets with minimal distortion from around one hundred microns to ten microns. It reduces lateral distortion of the via hole pattern and conductor pattern with the matrix during manufacturing thereby allowing larger format sizes to be handled. It allows via holes to be placed in thinner ceramic sheets. It also minimizes problems associated with shrinkage of conductive via fill material. My method facilitates higher layer counts. Using my method, capacitors with one hundred layers and seven micron dielectric have been demonstrated. Via holes have been formed, filled and stacked in twenty-five micron sheets, one hundred and eight-five millimeters square with very minimal distortion.

While I have described preferred embodiments of my method of manufacturing a multi-layer ceramic component containing interlayer conductive-filled via holes, it should be apparent to those skilled in the art that my invention may be modified in both arrangement and detail. Therefore, the protection afforded any invention should only be limited in accordance with the scope of the following claims.

I claim:

1. A method of making a multi-layered ceramic component with interlayer conductive-filled via holes, comprising the steps of:

a) depositing a slurry of a ceramic material onto a plastic carrier tape;

b) drying the slurry to form a ceramic layer on the plastic carrier tape;

c) applying a first laser beam to the ceramic layer until a first hole having a first predetermined diameter is formed in the ceramic layer; and d) applying a second laser beam to the plastic carrier tape in an area adjacent the first hole in the ceramic layer until a second hole having a second predetermined diameter smaller than the first predetermined diameter is formed in the plastic carrier tape the second hole communicating with the first hole.

2. The method of claim 1, and including the step of filling the first hole in the ceramic layer with a conductive paste of sufficient amount so that a portion of the conductive paste is drawn into the second hole in the plastic carrier tape, thereby removing any air trapped in the conductive paste.

3. The method of claim 2 including the step of:

printing a conductive pattern onto the ceramic layer and cutting the ceramic material with a die without cutting the plastic carrier tape; and peeling off the plastic carrier tape layer, thereby shearing off the portion of the conductive paste that had been drawn into the second hole in the plastic carrier tape to eliminate protrusions of the conductive paste from the ceramic layer.

4. The method of claim 1 wherein the ratio of the first predetermined diameter to the second predetermined diameter is about 4:1.

5. The method of claim 4 wherein the diameter of the first hole in the ceramic layer is about 0.004 inches and the diameter of the second hole in the plastic carrier tape is about 0.001 inches.

6. The method of claim 1 wherein the first laser beam and the second laser beam are generated by the same laser light source.

7. The method of claim 6 wherein the laser light source is an Eximir laser.

8. The method of claim 6 wherein the laser light source is a $CO_2$ laser.

9. The method of claim 6 wherein the laser light source is Ultraviolet laser.

10. The method of claim 1 wherein the first laser beam and the second laser beam are generated by different laser light sources.

11. The method of claim 10 wherein the first laser beam is generated by a $CO_2$ laser light source and the second laser beam is generated by an Eximir laser light source.

* * * * *